United States Patent [19]
Ostrander et al.

[11] 4,130,174

[45] Dec. 19, 1978

[54] LOUDSPEAKER

[75] Inventors: Walter M. Ostrander, Bridgewater; Malcolm M. Scholl, Bethlehem, both of Conn.; Edward R. Minott, Ellsworth, Me.; Christopher D. Smith, New Milford, Conn.

[73] Assignee: Audioanalyst, Inc., Brookfield, Conn.

[21] Appl. No.: 800,205

[22] Filed: May 25, 1977

[51] Int. Cl.[2] .......... H05K 5/00; A47B 81/06

[52] U.S. Cl. .......... 181/146; 181/147; 181/151; 181/154; 181/155; 181/199

[58] Field of Search .......... 181/144–151, 181/154, 155, 166, 199, DIG. 1; 179/181 F

[56] References Cited

U.S. PATENT DOCUMENTS

| | | | |
|---|---|---|---|
| 3,138,667 | 6/1964 | Avedon | 181/DIG. 1 |
| 3,424,873 | 1/1969 | Walsh | 181/166 |
| 3,720,285 | 3/1973 | Russell et al. | 181/151 |
| 3,867,996 | 2/1975 | Lou | 181/145 |
| 3,976,848 | 8/1976 | Estes | 181/166 |
| 3,982,607 | 9/1976 | Evans | 181/151 |

FOREIGN PATENT DOCUMENTS

| | | | |
|---|---|---|---|
| 251133 | 4/1964 | Australia | 181/DIG. 1 |
| 697869 | 11/1964 | Canada | 181/DIG. 1 |
| 1326414 | 4/1963 | France | 181/DIG. 1 |

*Primary Examiner*—Stephen J. Tomsky
*Attorney, Agent, or Firm*—Mattern, Ware, Davis & Stoltz

[57] ABSTRACT

A loudspeaker having precise imaging, neutrality of frequency response, and controlled mid-range and tweeter dispersion. The loudspeaker incorporates an open cell, reticulated polyurethane cartridge for placement of a supertweeter mounted in the loudspeaker at an angle of 45° from other speaker axes. The housing therefore may be positioned so as to adjust the high frequency acoustic radiation to the right or the left of the loudspeaker frontal axis, thus making a mirror image pair of the loudspeakers possible. In addition, angled corner posts are arranged at the front corners of the loudspeaker in order to reflect back into the loudspeaker mid-range and high frequency sounds that strike the posts.

19 Claims, 6 Drawing Figures

LOUDSPEAKER

BACKGROUND OF THE INVENTION

1. Field of the Invention

The present invention relates to loudspeakers and particularly to loudspeakers using multiple speakers within a single enclosure for high fidelity applications.

2. Description of the Prior Art

Although a number of prior art patents pertain to loudspeakers and the housings of single speakers, none of these prior art patents disclose or suggest the novel features of the present invention; and in particular, the non-rigid mounting of a tweeter within an open cell reticulated polyurethane cartridge so as to position the tweeter 45° off axis with respect to the driver axis of the remaining speakers within the system and further so as to allow placement of the cartridge either 45° to the left or 45° to the right of the remaining speaker driver axes. In addition, none of the prior art patents solely or in combination with each other disclose a loudspeaker enclosure with angular cross-sectional corner posts positioned with respect to the mid-range and high frequency speakers for preventing the majority of off axis mid and high frequency sound waves from emanating into the outside environment, and more particularly, from being reflected into the main radiating pattern of the mid-range and high frequency components waves or back to the sound generating surfaces of the mid-range and high frequency drivers.

The patents developed in a search of the prior art are set forth below in Table I:

TABLE I

| Patent No. | Inventor | Date |
|---|---|---|
| U.S. | | |
| 3,135,349 | Lahti | 1964 |
| 3,155,774 | Howell | 1964 |
| 3,187,832 | Broadley | 1965 |
| 3,345,607 | Nelkin et al | 1967 |
| 3,384,719 | Lanzara | 1968 |
| 3,512,605 | McCorkle | 1970 |
| 3,590,942 | Globa | 1971 |
| 3,684,051 | Hopkins | 1972 |
| 3,708,035 | Sotome | 1973 |
| 3,720,285 | Russell et al | 1973 |
| 3,747,880 | Bock | 1973 |
| 3,824,343 | Dahlquist | 1974 |
| 3,834,486 | Tauge et al | 1974 |
| 3,867,996 | Lou | 1975 |
| 3,903,989 | Bauer | 1975 |
| 4,006,308 | Ponsgen | 1977 |
| Australia | | |
| 251,133 | Messer | 1964 |
| Canada | | |
| 697,869 | Smolarczyk | 1964 |
| France | | |
| 1,326,414 | Hageman | 1963 |

Thus, although a number of these prior art patents, such as U.S. Pat. Nos. 3,187,832, Broadley; 3,135,349, Lahti; 3,720,285, Russell et al.; 3,867,996, Lou; French Pat. No. 1,326,414; Australian Pat. No. 251,133; and Canadian Pat. No. 697,869 disclose the use of polyurethane or other sound absorbing materials to attenuate unwanted sound waves, none of these prior art patents disclose or suggest the use of angled corner posts to reflect mid and high frequency sound waves striking the posts into a sound absorbing material. Furthermore, although U.S. Pat. No. 3,903,989, Bauer, discloses a loudspeaker having a cabinet with a rotationally adjustable vertically oriented baffle on which additional loudspeaker drivers for generating mid and high frequency signals are supported, this reference does not disclose or suggest the use of an open cell reticulated foam cartridge for a high frequency speaker positionable either 45° to the left or 45° to the right of the axis of the remaining speakers within the loudspeaker.

SUMMARY OF THE INVENTION

A loudspeaker for generating in a single enclosure high fidelity sound with precise imaging, naturalness and controlled mid-range and high frequency dispersion is disclosed. The loudspeaker has a lower cabinet portion for mounting one or more low frequency woofers in axial alignment with each other. Above the woofers and in axial alignment therewith is a mid-range speaker having its driving element spaced inwardly within the enclosure equidistant with respect to the woofer voice coil in order to minimize phase distortion. The mid-range speaker is mounted to a flakeboard plate forming part of a mid-range and high frequency baffle. A dome or horn tweeter, also mounted to the flakeboard plate, is axially aligned and positioned above the mid-range speaker with its voice coil also positioned equidistant with respect to the voice coil of the mid-range speaker and woofers for generating a central beam of high frequency sound. The plate to which the mid-range speaker and dome or horn tweeter are mounted slidingly interfits with a frontally positioned block of open cell foam positioned above the lower cabinet housing. A thin pad of closed cell foam is interposed between this block and the woofer cabinet to isolate the high frequency and low frequency signals generated within the upper block and lower woofer cabinet respectively, thereby minimizing any undesired resonance.

Positioned above the mid-range speaker and tweeter and positionable within an upper open-ended recess within the frontal block is another block or cartridge of open celled reticulated foam with a centrally located cutout dimensioned for receipt of a piezoelectric tweeter, sometimes called a supertweeter. This recess is preferably positioned at a 45° angle with respect to the axes of the remaining speakers so that the supertweeter axis is also at a 45° angle with respect to the axes of the remaining speakers. By turning the open cell supertweeter block over, the supertweeter is either positioned 45° to the right or 45° to the left of the other speakers; thereby making the loudspeaker usable for either a left-hand channel or a right-hand channel in a room. The supertweeter combines with the remaining speakers to yield a uniform sound field in front of the loudspeaker from approximately 45° to one side of the loudspeaker to 60° to the other side, the sides being reversible by turning over the supertweeter block.

The outer front corners of the loudspeaker incorporate a pair of triangular cross-sectional corner posts which have an elongated angled member facing the tweeters and mid-range speaker so as to substantially prevent these speakers from dispersing sound in excess of about 70° normal to the front of the loudspeaker. Most sound waves produced at a greater angle strike the corner posts and are reflected into sound absorbing material within the loudspeaker so as to minimize any reflected sound waves toward the signal source or into the front radiating sound field of the loudspeaker.

OBJECTS OF THE INVENTION

Therefore, it is a principal object of the present invention to provide a loudspeaker for enclosing multiple speakers having different preferred frequency responses in an arrangement to provide precise imaging with minimal coloration of the frequency response and with controlled dispersion of the mid-range and high frequency sound components.

Another object of the present invention is to provide a loudspeaker of the above description wherein the mid-range and high frequency speakers are acoustically isolated from the woofers within the same loudspeaker;

A further object of the present invention is to provide a loudspeaker of the above description wherein the mid-range speaker and a tweeter are housed within a baffle compartment which slidingly interfits with a block of open cell foam positioned above the cabinet housing the woofers;

Another object of the present invention is to provide a loudspeaker of the above description wherein a supertweeter is mounted within an open cell reticulated foam cartridge interfitting within an upper opening in the block of foam within which the baffle compartment housing the mid-range speaker and tweeter are positioned;

A still further object of the present invention is to provide a loudspeaker of the above description wherein the supertweeter is mounted within a recess of the open-celled cartridge at a 45° angle with respect to the axis normal to the front of the loudspeaker, wherein the open-celled cartridge may be turned over so as to allow the supertweeter to be either at a 45° angle to the left or a 45° angle to the right of the normal axis of the loudspeaker;

An additional object of the present invention is to provide a loudspeaker of the above description having corner posts which minimize undesired sound wave reflections into the main radiating pattern of the loudspeaker;

Other objects of the present invention will in part be obvious and will in part appear hereinafter.

THE DRAWINGS

For a fuller understanding of the nature and objects of the present invention, reference should be had to the following detailed description taken in conjunction with the accompanying drawings, in which.

Figure 3:
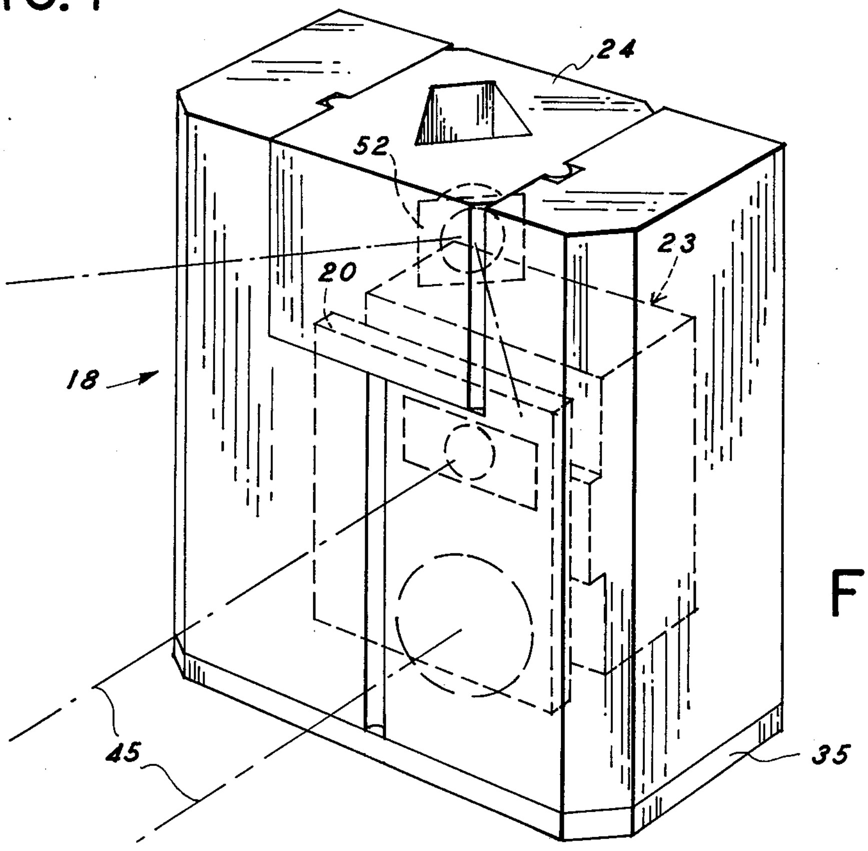
FIG. 3 is a perspective view of the frontal block of foam used to house the mid-range and high frequency speaker components of the loudspeaker shown in FIGS. 1 and 2, said block showing in phantom the placement and axis of the mid-range and high frequency speakers mounted within this block for receipt within the open space shown in the perspective view of FIG. 2.
Figure 4:
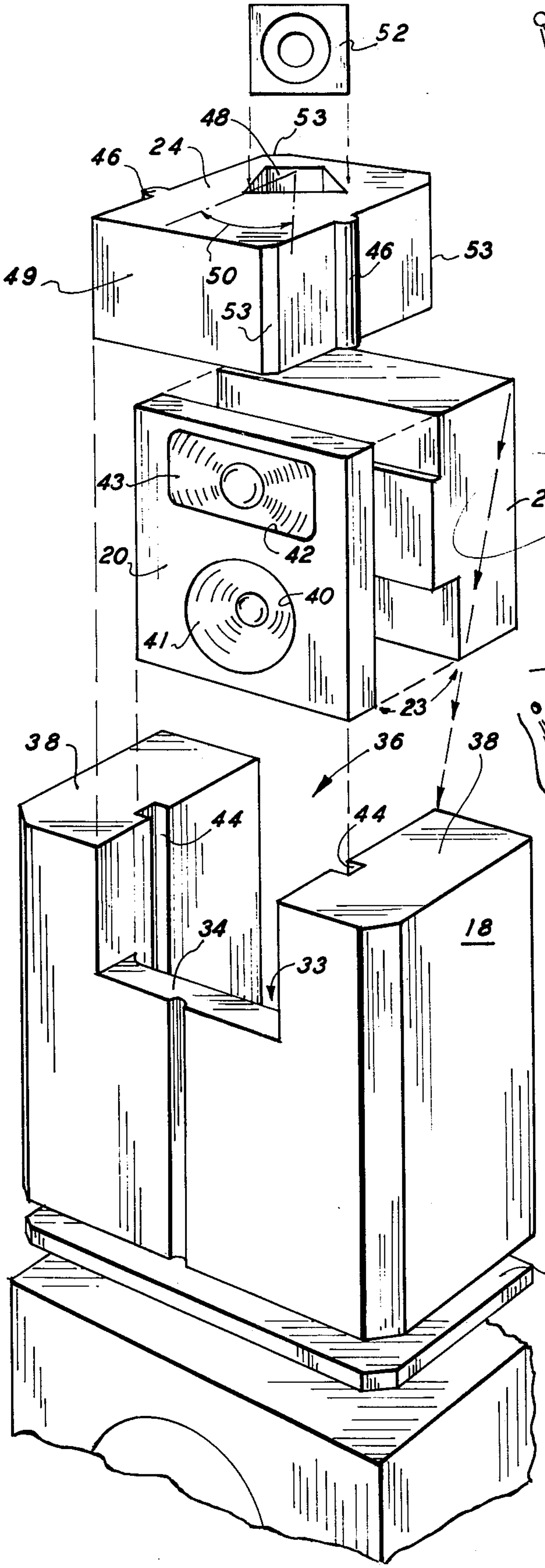
Figure 5:
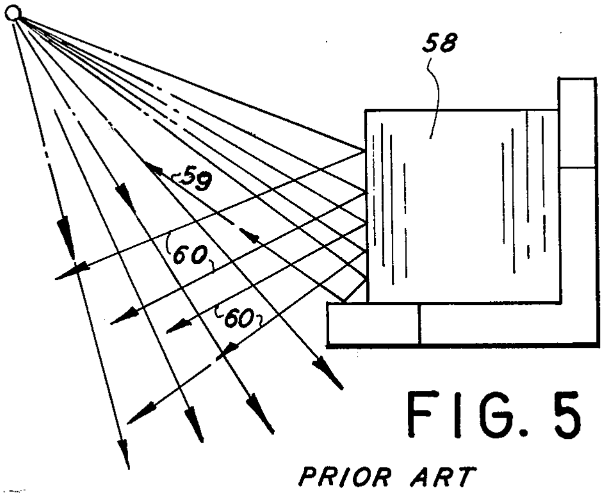
FIG. 5 PRIOR ART
Figure 6:
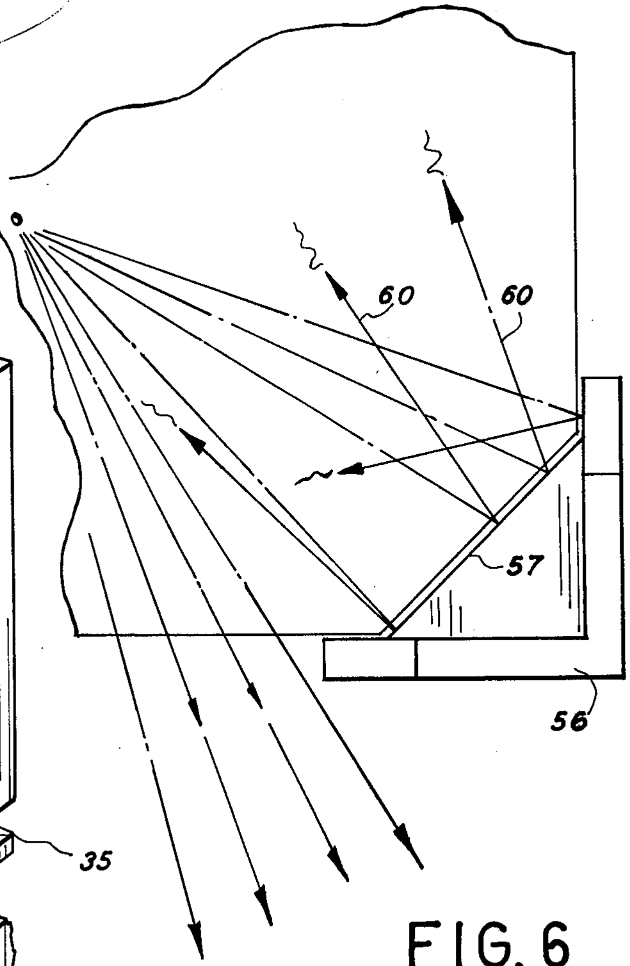

FIG. 4 is a perspective assembly view of the frontal block shown in FIG. 3 in conjunction with the baffle compartment, the mid-range speaker and tweeter, as well as the open-celled foam cartridge housing the supertweeter, said view illustrating the placement of the speakers within the cartridge and baffle compartment and their arrangement and placement with respect to the frontal block, and the placement of the foam block on top of the lower cabinet housing the woofers of the loudspeaker;

FIG. 5 is a diagrammatic cross-sectional top plan view of typical corner posts found in prior art loudspeakers illustrating the path of sound waves in the vicinity of the corner post as well as sound waves striking the corner post; and FIG. 6 is a diagrammatic cross-sectional top plan view of a corner post used in the loudspeaker of the present invention also illustrating the path of sound waves in the vicinity of the corner post as well as sound waves striking the corner post.

DETAILED DESCRIPTION

Figure 1:
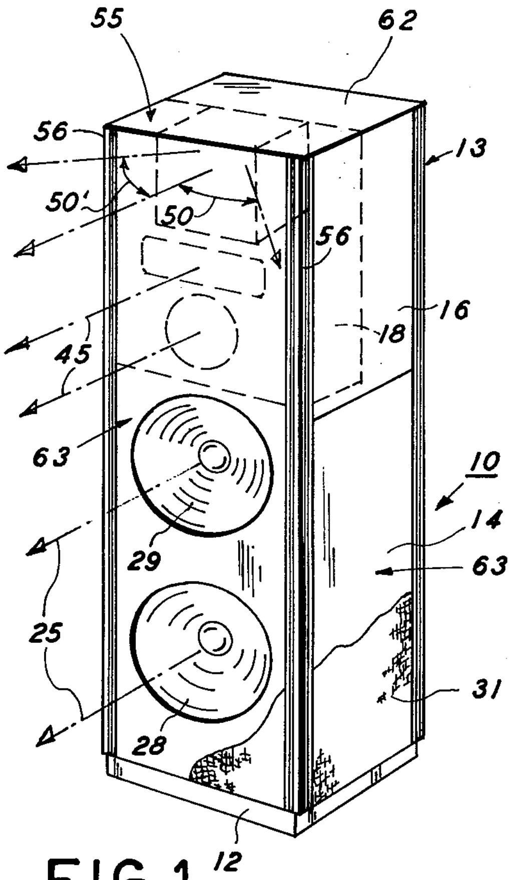
FIG. 1 is a partially broken away perspective view of the loudspeaker according to the present invention illustrating the axis of the speakers within the loudspeaker.
Figure 2:
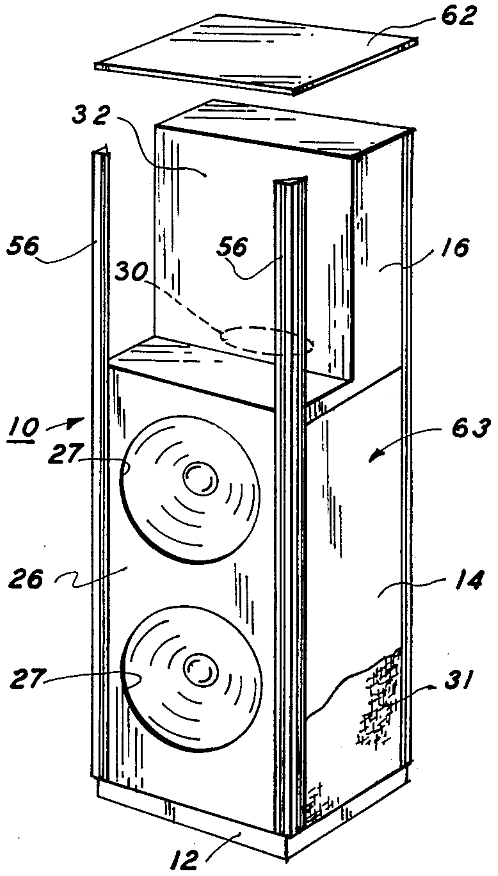
FIG. 2 is a partially broken away assembly perspective view of the loudspeaker shown in FIG. 1.

As can best be seen in FIGS. 1, 2 and 3, a loudspeaker 10 according to the present invention has an elongated rectangular shape with a square base plate 12 for placing the system upright in a room. The loudspeaker incorporates several portions including a cabinet shown generally as 13, incorporating a lower cabinet 14, an upper backing compartment 16, a frontal block 18, an upper recess 32 for receipt of block 18, a mid-range and high frequency baffle compartment 23, and a supertweeter cartridge 24. The lower cabinet 14 is preferably hollow having a front mounting plate 26 with two circular apertures 27 for placement of a low frequency subwoofer speaker 28 and a woofer speaker 29 having central radiating patterns normal to the front of the loudspeaker, as shown by arrows 25. These woofers are preferably of the cone type.

The sides of cabinet 14 are preferably open with a grill cloth 31 placed thereover, as well as over all the remaining exterior surfaces of cabinet 13, except bottom plate 12. These open sides of cabinet 14 help avoid internal reflection of sound waves. The solid back of cabinet 14 and upper compartment 16 are formed with acoustically absorbent material that helps prevent the generation of "dipole" patterns otherwise formed by the sound waves generated by the back surfaces of the speakers. The upper backing compartment 16 is formed over the low frequency speaker compartment 14 and has an oval aperture 30 for movement of air therethrough generated when the low frequency speakers are activated.

As best seen in FIGS. 1, 2, 3 and 4, the frontal block 18 interfits within a recess 32 and, in conjunction with the mid-range and high frequency baffle compartment 23 and the supertweeter cartridge 24, house the remaining speakers of the loudspeaker. As best seen in FIGS. 3 and 4, the frontal block 18 has a central recess 33 formed behind the front surface 34 of the block and an upwardly open-ended recess 36 formed between side members 38 of block 18. Block 18 is preferably fabricated from an open cell reticulated polyurethane foam in order to allow acoustical waves to pass therethrough without distortion or appreciable attenuation. A plate 35 is mounted between block 18 and cabinet 14 to isolate and help prevent low frequency sounds generated within cabinet 14 from entering block 18. This plate is preferably made from a ½ inch thick pad of closed cell foam.

As also seen in FIG. 4, the mid-range and high frequency baffle compartment 23 is formed by a mid-range and high frequency mounting plate 20 and a backing block 22. The mounting plate 20 has a lower circular aperture 40 for placement of a mid-range speaker 41 and an aperture 42 shaped for placement of a high frequency tweeter 43, preferably of the dome or horn type. The mounting plate is preferably fabricated from a high density flakeboard and has a preferable thickness of ½ inch. This mounting plate interfits with the frontal block 18 by slidingly intefitting within elongated slots 44 formed within side members 38. The central radiating patterns of speakers 41 and 43 are normal to the front of the loudspeaker, as shown by arrows 45.

The remaining solid portion of the mid-range and high frequency baffle compartment 23 is the backing block 22 which also interfits within recess 33. This backing block has a preferable average thickness of 4⅜ inches so as to provide an optimal air space behind mid-range speaker 41 and tweeter 43. The backing block is preferably fabricated from a closed cell foam material for maximizing sound absorption generated by the inner acoustical surfaces of the mid-range speaker and tweeter.

Placed above the mid-range and high frequency baffle compartment 23 is a supertweeter cartridge 24 which interfits within upper recess 36 of frontal block 18. The supertweeter cartridge incorporates a pair of sidewardly protruding ribs 46 for interfitting within elongated slots 44 of side members 38. The supertweeter cartridge further incorporates a trapezoidal cross-sectional shaped recess 48 spaced at a preferable angle of 45° with respect to front surface 49 of the cartridge. This angle is shown by arrows 50. Recess 48 is dimensioned to house a supertweeter 52. The supertweeter cartridge is also preferably formed from an open cell reticulated foam such as polyurethane in order to allow unhampered transmission of the very high frequencies generated by supertweeter 52. The supertweeter compartment 24 further incorporates three angled corners 53 which facilitate manufacture of the loudspeaker by indicating to the workperson the front and back of the compartment 24 as well as the direction of acoustical radiation of the supertweeter. By turning supertweeter compartment 24 completely over, the frontal angle corner 53 is on the opposite side of that shown in FIG. 4 and therefore the acoustical radiation of supertweeter 52 changes from a left-hand orientation (viewed outwardly from the loudspeaker) to a right-handed radiating pattern. The central radiating pattern of the supertweeter is then shown by arrow 50′ in FIG. 1. This variation in the direction of the supertweeter 52 provides for the easy manufacturing of right-handed and left-handed loudspeakers from the same constituent parts. As shown in FIGS. 1 and 2, by removal of a top plate 62, the home user may also change the loudspeaker from a right-handed to a left-handed sound radiating orientation.

As is well known in the art, high frequency acoustical waves are highly directional in nature and therefore, by placement of the supertweeter recess 48 at an angle of approximately 45° with that of the central radiating pattern of the remaining speakers, a loudspeaker suitable for either left-handed or right-handed listening conditions is obtained. The resultant loudspeaker 10 has a substantially uniform sound radiating pattern — also called polar response — throughout a dispersal angle of approximately 120° with this pattern favoring the right side or left side of the loudspeaker depending on the placement of supertweeter 52.

In order to minimize phase distortion from the various speakers within the loudspeaker system, the spacing of the drivers for each speaker is vertically aligned. Furthermore, in order to control mid-range and tweeter dispersion so as to prevent reflected waves from the loudspeaker from interfering with the primary radiating patterns of the mid-range and high frequency speakers, a pair of specially shaped front corner posts 56 are utilized. These corner posts in the region of the frontal block 18 have a shape as shown in FIG. 6. The corner posts include an inwardly positioned elongated angled member 57 to minimize undesired dispersion. As best seen in FIG. 5, a corner post 58 used in prior art loudspeakers generally had the undesirable characteristic of reflecting acoustic waves striking the post either back toward the speaker source as shown by arrow 59 or into the primary radiating pattern of the acoustic waves, as shown by arrows 60. In the present invention, the elongated angled member 57 causes the striking acoustic waves to reflect back toward the backing block 22 which absorbs the sound waves thereby preventing interference with the desired radiating pattern of the speaker.

As best shown in FIGS. 1 and 2, to complete the loudspeaker a top plate 62 is mounted over the upper termination of corner posts 56 as well as over the upper surface of the backing compartment 16 and the frontal block 18. Grill cloth 31 is preferably installed about the side peripheries of the loudspeaker enclosure to give a pleasing appearance.

Thus, what has been described is a loudspeaker incorporating low, mid and high frequency speaker components axially aligned for minimum phase distortion, precise imaging, minimal coloration and controlled dispersion of the sound produced by the system. The loudspeaker incorporates a unique frontal block dimensioned for receiving a mid-range and high frequency components mounted to a slidably interfitting baffle and a supertweeter cartridge having a supertweeter recess positioned off axis with respect to the remaining speakers of the loudspeaker. This supertweeter cartridge also slidably interfits with the frontal block and may be turned over to allow the supertweeter to disperse its sound either to the left-hand side or right-hand side of the loudspeaker, thereby providing for optimal stero pairing. In addition, the loudspeaker of the present invention incorporates front corner posts dimensioned for minimizing unwanted dispersion of the high and mid frequency sound waves by reflecting these unwanted sound waves back into acoustically absorbent material rather than into the desired radiating pattern of the loudspeaker.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed is:

1. A loudspeaker comprising:

(A) a cabinet having a lower portion, an upper rearwardly positioned backing compartment, and having an upper frontally disposed recess;

(B) at least one low frequency speaker frontally mounted to the lower portion of the loudspeaker cabinet with vertical alignment of the driver portion of each speaker;

(C) a frontal block dimensioned for receipt within the recess in the upper frontal portion of the loudspeaker cabinet, said block having a central recess and an upwardly protruding open-ended second recess, said block fabricated from a substantially acoustically transparent material;

(D) a mid-range and high frequency baffle compartment dimensioned for interfitting within the central recess of the frontal block and having a frontally disposed mounting plate and a rearwardly positioned backing block, said backing block fabricated from an acoustically absorbent material;

(E) a mid-range speaker mounted to the mounting plate of the baffle compartment so as to have a radiating pattern substantially aligned with the axis normal to the front of said cabinet, and having its driver vertically aligned with the drivers of the other speakers of the loudspeaker;

(F) a high frequency speaker mounted to the mounting plate of the baffle compartment so as to have a radiating pattern substantially aligned with the axis normal to the front of said cabinet, and having its driver vertically aligned with the drivers of the other speakers of the loudspeaker;

(G) a supertweeter cartridge fabricated from an acoustically transparent material dimensioned for receipt in an upright or an inverted manner within the upper second recess of the frontal block and having a recess formed therein dimensioned for receipt of a supertweeter, said supertweeter recess positioned angularly away from the axis normal to the front portion of the loudspeaker cabinet so as to have an orientation favoring one side of the cabinet when mounted in the upright manner, and favoring the other side when mounted in the inverted manner; and (H) a supertweeter dimensioned for placement within the recess of the supertweeter cartridge at substantially the same angular displacement that the supertweeter recess makes with the normal axis of the loudspeaker, the supertweeter having its driver vertically aligned with the driver of the remaining speakers of the loudspeaker;

whereby the loudspeaker incorporates low frequency, mid-range, and high frequency components vertically aligned with each other to minimize phase distortion and to yield precise imaging with minimal coloration, and incorporating a supertweeter angularly disposed with respect to the remaining speakers of the loudspeaker in order to yield a high frequency radiating pattern of substantially uniform polar response for the central radiating pattern and an angularly disposed radiating pattern to either one side or the other side of the loudspeaker depending upon the orientation of the supertweeter cartridge.

2. A loudspeaker as defined in claim 1 further comprising:

(I) a plate formed from an acoustically absorbent material spaced between the frontal block and the lower portion of the cabinet housing the low frequency speaker components in order to isolate the low frequency sounds from the frontal block within which the mid-range and high frequency speaker components are housed.

3. A loudspeaker as defined in claim 2, wherein an aperture is positioned between the upper backing compartment of the loudspeaker cabinet and the lower portion of the cabinet housing the low frequency speaker components, the upper backing compartment having a substantially hollow interior for allowing the sound waves generated by the back surfaces of the low frequency speaker components to be partially absorbed within the recess of this upper backing compartment.

4. A loudspeaker as defined in claim 3, wherein the lower cabinet portion of the loudspeaker and the upper backing compartment have substantially acoustically transparent sides in order to minimize internal reflections of the low frequency sounds generated by the low frequency speaker components.

5. A loudspeaker as defined in claim 4, wherein the lower portion of the cabinet has first and second vertically aligned apertures in its front surface, and wherein a subwoofer low frequency speaker is mounted about the lowermost of said apertures and a woofer low frequency speaker is mounted about the other vertically aligned aperture.

6. A loudspeaker as defined in claim 1, wherein the frontal block has a pair of side members, each having an elongated slot formed vertically along its interior surface, said slot dimensioned for receipt of the plate of the mid and high frequency baffle and wherein the supertweeter cartridge further incorporates a pair of sidewardly protruding ribs dimensioned for receipt within the upper portion of the elongated slots.

7. A loudspeaker as defined in claim 6, wherein the frontal block and supertweeter cartridge are fabricated from an open-cell reticulated foam material and wherein the backing block of the baffle compartment is fabricated from a closed-cell foam material.

8. A loudspeaker as defined in claim 1, further comprising:

(I) a pair of frontally mounted corner posts, each having an elongated angled member extending along a length at least substantially equal to the vertical height of the frontal block, each angled member positioned acutely rearwardly so that sound waves striking the angled member are substantially reflected into the interior of the loudspeaker cabinet to be absorbed by the acoustically absorbent material of the backing block; thereby minimizing reflection of acutely dispersed sound waves into the main radiating pattern of the loudspeaker.

9. A loudspeaker as defined in claim 8, further comprising:

(J) a lower mounting plate mounted to the bottom of the loudspeaker cabinet; and (K) a grill cloth mounted to the exterior surfaces of the loudspeaker cabinet other than the lower mounting plate.

10. A loudspeaker as defined in claim 1, further comprising:

(I) a top plate removably mounted to the uppermost termination of the cabinet so as to allow the user to remove the supertweeter cartridge from the frontal block and reinsert the cartridge in the frontal block in an inverted manner, so that the loudspeaker radiating pattern may be user selected to favor one side or the other side of the loudspeaker.

11. A loudspeaker comprising:

(A) a lower cabinet portion having an apertured front plate;

(B) at least one low frequency speaker frontally mounted to an aperture in the front plate of the lower cabinet portion;

(C) an upper cabinet portion having a recess formed therein;

(D) a frontal block dimensioned for receipt within the recess of the upper cabinet portion, said block having a central recess and an upwardly protruding open-ended second recess, said block fabricated from a substantially acoustically transparent material;

(E) a baffle compartment dimensioned for interfitting within the central recess of the frontal block;

(F) at least one mid-range speaker mounted within the baffle compartment;

(G) at least one high frequency speaker mounted within the baffle compartment;

(H) a supertweeter cartridge fabricated from a substantially acoustically transparent material dimensioned for receipt in an upright or an inverted manner within the upper second recess of the frontal block and having a recess formed therein dimensioned for receipt of a supertweeter, said supertweeter recess positioned angularly away from the axis normal to the front portion of the loudspeaker; and (I) a supertweeter dimensioned for placement within the recess of the supertweeter cartridge so as to be angularly displaced from the axis normal to the front portion of the loudspeaker;

whereby the loudspeaker incorporates low frequency, mid-range, and high frequency speaker components and a supertweeter angularly disposed with respect to the axis normal to the front of the loudspeaker.

12. A loudspeaker as defined in claim 11, further comprising:

(J) a plate formed from an acoustically absorbent material spaced between the frontal block and the lower cabinet portion of the loudspeaker in order to isolate the low frequency sounds from the front block generated by the low frequency speaker components.

13. A loudspeaker as defined in claim 12 wherein the frontal block has a pair of side members, each having an elongated slot formed vertically along its interior surface, and wherein the baffle compartment incorporates a frontally disposed mounting plate dimensioned for receipt within the slots of the frontal block side members and also incorporating a rearwardly positioned backing block fabricated from an acoustically absorbent material so that the mid-range and high frequency speaker components mounted within the baffle compartment are mounted to the mounting plate with the backing block behind the speaker components; and wherein the supertweeter cartridge further incorporates a pair of sidewardly protruding ribs for receipt within the upper portion of the elongated slots of the frontal block side members in either the upright or inverted manner of mounting the supertweeter cartridge in the front block.

14. A loudspeaker as defined in claim 13, wherein the frontal block and supertweeter cartridge are fabricated from an open-cell reticulated foam material and wherein the backing block of the baffle compartment is fabricated from a closed-cell foam material.

15. A loudspeaker as defined in claim 14, further comprising:

(K) a pair of frontally mounted corner posts, each having an elongated angled member extending along a length at least substantially equal to the vertical height of the frontal block, each angled member facing the rearward portion of the loudspeaker at an acute angle so that sound waves striking the angled member are substantially reflected into the interior of the loudspeaker cabinet to be absorbed by the acoustically absorbent material of the backing plate; thereby minimizing reflection of acutely dispersed sound waves into the main radiating pattern of the loudspeaker.

16. A loudspeaker as defined in claim 15, further comprising:

(L) a top plate removably mounted to the uppermost termination of the upper cabinet portion so as to allow the user to remove the supertweeter cartridge from the frontal block and reinsert the cartridge in the frontal block in an inverted manner, so that the loudspeaker radiating pattern may be user-selected to favor one side or the other side of the loudspeaker.

17. A frontal block for use in a loudspeaker comprising:

(A) a block of substantially acoustically transparent material, said block having a central recess and an upwardly protruding open-ended second recess;

(B) a baffle compartment dimensioned for interfitting within the central recess of the frontal block;

(C) at least one mid-range speaker mounted within the baffle compartment so as to have a radiating pattern substantially aligned with the axis normal to the front of said block;

(D) at least one high frequency speaker mounted within the baffle compartment so as to have a radiating pattern substantially aligned with the axis normal to the front of said block;

(E) a supertweeter cartridge fabricated from a substantially acoustically transparent material dimensioned for receipt in an upright or an inverted manner within the upper second recess of the frontal block and having a recess formed therein dimensioned for receipt of a supertweeter, said supertweeter recess positioned angularly, away from the axis normal to the front portion of said frontal block; and (F) a supertweeter dimensioned for placement within the recess of the supertweeter cartridge so as to be angularly displaced from the axis normal to the front portion of the frontal block;

whereby the frontal block incorporates mid-range and high frequency speaker components and a supertweeter angularly disposed with respect to the axis normal to the front of the frontal block in order to yield a high frequency radiating pattern of substantially uniform polar response for both the central radiating pattern and an angularly disposed radiating pattern to either one side or the other side of the frontal block, depending upon the orientation of the supertweeter cartridge.

18. A frontal block as defined in claim 17, wherein the block has a pair of side members, each having an elongated slot formed vertically along its interior surface, and wherein the baffle compartment incorporates a frontally disposed mounting plate dimensioned for receipt within the slots of the block side members and also incorporating a rearwardly positioned backing block fabricated from an acoustically absorbent material so that the mid-range and high frequency speaker components mounted within the baffle compartment are mounted to the mounting plate with the backing block behind the speaker components; and wherein the supertweeter cartridge further incorporates a pair of sidewardly protruding elongated ribs for receipt within the upper portion of the elongated slots of the block side members in either an upright or an inverted manner.

19. A frontal block as defined in claim 18, wherein both the block and supertweeter cartridge are fabricated from an open-cell foam material.

* * * * *